(12) United States Patent
Xia et al.

(10) Patent No.: US 8,847,224 B2
(45) Date of Patent: Sep. 30, 2014

(54) FIN-BASED BIPOLAR JUNCTION TRANSISTOR AND METHOD FOR FABRICATION

(75) Inventors: Wei Xia, Irvine, CA (US); Xiangdong Chen, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 149 days.

(21) Appl. No.: 13/246,710

(22) Filed: Sep. 27, 2011

(65) Prior Publication Data

US 2013/0075729 A1    Mar. 28, 2013

(51) Int. Cl.
*H01L 29/10* (2006.01)
*H01L 29/732* (2006.01)
*H01L 29/66* (2006.01)

(52) U.S. Cl.
CPC ...... *H01L 29/66272* (2013.01); *H01L 29/1004* (2013.01); *H01L 29/732* (2013.01)
USPC .. 257/51; 257/517; 257/E29.174; 257/E21.37

(58) Field of Classification Search
CPC .. H01L 29/7831; H01L 29/785; H01L 21/845
USPC .............. 257/51, E29.174, E21.37, 517
See application file for complete search history.

(56) References Cited

U.S. PATENT DOCUMENTS

| | | | |
|---|---|---|---|
| 2006/0197123 A1 | 9/2006 | Lochtefeld et al. | |
| 2010/0187656 A1* | 7/2010 | Ke et al. | 257/586 |
| 2010/0246277 A1 | 9/2010 | Widjaja et al. | |
| 2011/0248382 A1* | 10/2011 | Pellizzer et al. | 257/539 |
| 2012/0014188 A1* | 1/2012 | Widjaja et al. | 365/189.04 |

FOREIGN PATENT DOCUMENTS

WO    WO 2010/076825 A1    7/2010

OTHER PUBLICATIONS

Office Action issued Jun. 20, 2014, in Taiwan Patent Application No. 101131864.

* cited by examiner

*Primary Examiner* — Marc Armand
(74) *Attorney, Agent, or Firm* — Oblon, Spivak, McClelland, Maier & Neustadt, L.L.P.

(57) ABSTRACT

According to one exemplary embodiment, a fin-based bipolar junction transistor (BJT) includes a wide collector situated in a semiconductor substrate. A fin base is disposed over the wide collector. Further, a fin emitter and an epi emitter are disposed over the fin base. A narrow base-emitter junction of the fin-based BJT is formed by the fin base and the fin emitter and the epi emitter provides increased current conduction and reduced resistance for the fin-based BJT. The epi emitter can be epitaxially formed on the fin emitter and can comprise polysilicon. Furthermore, the fin base and the fin emitter can each comprise single crystal silicon.

20 Claims, 8 Drawing Sheets

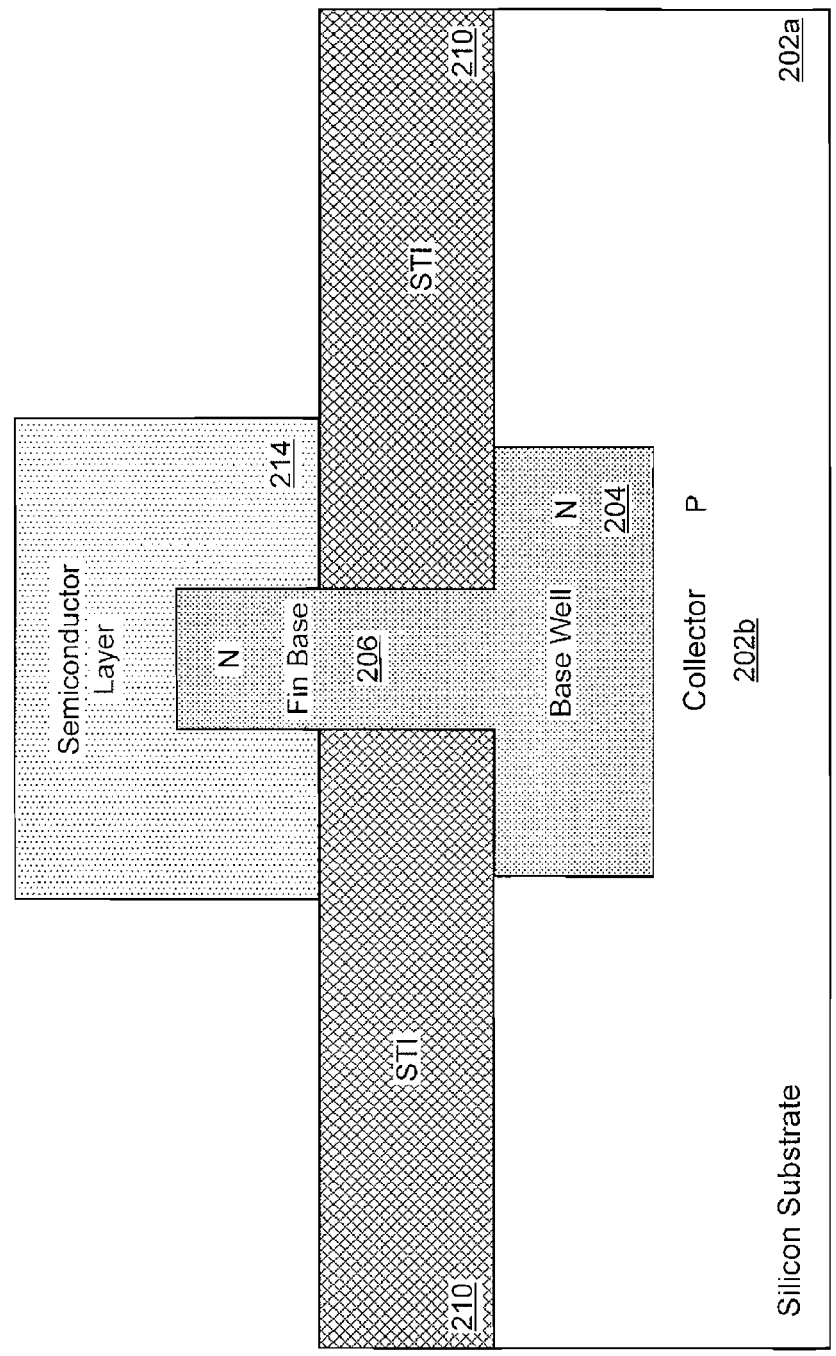

FIN-BASED BIPOLAR JUNCTION TRANSISTOR AND METHOD FOR FABRICATION

BACKGROUND OF THE INVENTION

1. Field of the Invention

The present invention is generally in the field of semiconductor devices. More particularly, the invention relates to fabrication of bipolar junction transistors.

2. Background Art

Bipolar junction transistors (BJTs) are commonly employed in amplifying and switching applications. As such, it is desirable to integrate BJT fabrication into complementary metal-oxide-semiconductor (CMOS) processes. A conventional BJT fabricated with a BiCMOS (Bipolar CMOS) process includes adjacent doped semiconductor regions having an NPN or PNP doping configuration. The adjacent doped regions constitute an emitter, a base, and a collector. In the BiCMOS process, also referred to simply as a "CMOS process" in the present application, fabrication of the conventional BJT is integrated with fabrication of a lateral metal-oxide-semiconductor field-effect transistor (MOSFET). The collector of the conventional BJT can be formed in a substrate. The base of the conventional BJT can be formed in the collector utilizing formation steps for a well of the lateral MOSFET in the substrate. Furthermore, the emitter of the conventional BJT can be formed in the base utilizing formation steps for a source and drain of the lateral MOSFET in the substrate.

However, the conventional BJT fabricated in the CMOS process has poor performance and is thus not suitable for high performance applications. One cause of the poor performance of the conventional BJT is that the emitter is necessarily much smaller than the base. As such, the conventional BJT has high emitter series resistance and low current conduction capability. Another cause of the poor performance of the conventional BJT is that its base-emitter junction is not well defined. As such, the conventional BJT has high base leakage current.

It would be desirable to provide for a BJT that can have improved performance over the conventional BJT. It would further be desirable that fabrication of such a BJT can be integrated with CMOS processes.

SUMMARY OF THE INVENTION

A fin-base bipolar junction transistor and method for fabrication are provided. Features, advantages and various embodiments of the present invention are shown in and/or described in connection with at least one of the drawings, and are set forth more completely in the claims.

BRIEF DESCRIPTION OF THE DRAWINGS

FIG. 2E illustrates a cross-sectional view, which includes a portion of a wafer processed according to an embodiment of the present invention, corresponding to an intermediate step in the flowchart in FIG. 1.

DETAILED DESCRIPTION OF THE INVENTION

The present invention is directed to a fin-base bipolar junction transistor and method for fabrication. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
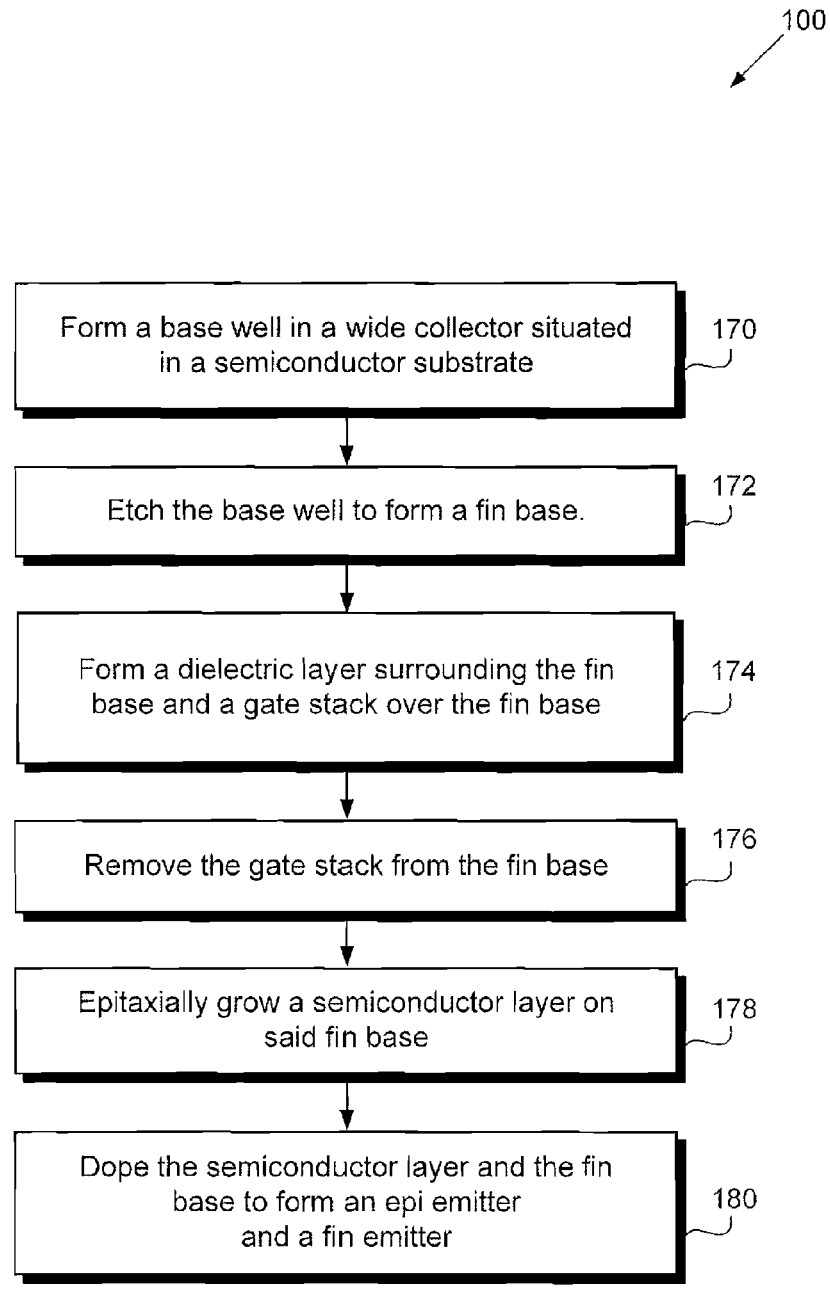
FIG. 1 shows a flowchart illustrating the steps taken to implement an embodiment of the present invention.

FIG. 1 shows a flow chart illustrating a method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 170 through 180 indicated in flowchart 100 are sufficient to describe at least one embodiment of the present invention; however, other embodiments of the invention may utilize steps different from those shown in flowchart 100. It is noted that the processing steps shown in flowchart 100 are performed on a portion of a wafer, which, prior to step 170, can include, among other things, a semiconductor substrate, such as a silicon substrate. The wafer may also be referred to as a semiconductor die or simply a die in the present application.

Moreover, structures 270 through 280 in FIGS. 2A through 2F illustrate the result of performing steps 170 through 180 of flowchart 100, respectively. For example, structure 270 shows a semiconductor structure after processing step 170, structure 272 shows structure 270 after the processing of step 172, structure 274 shows structure 272 after the processing of step 174, and so forth.

Figure 2A:
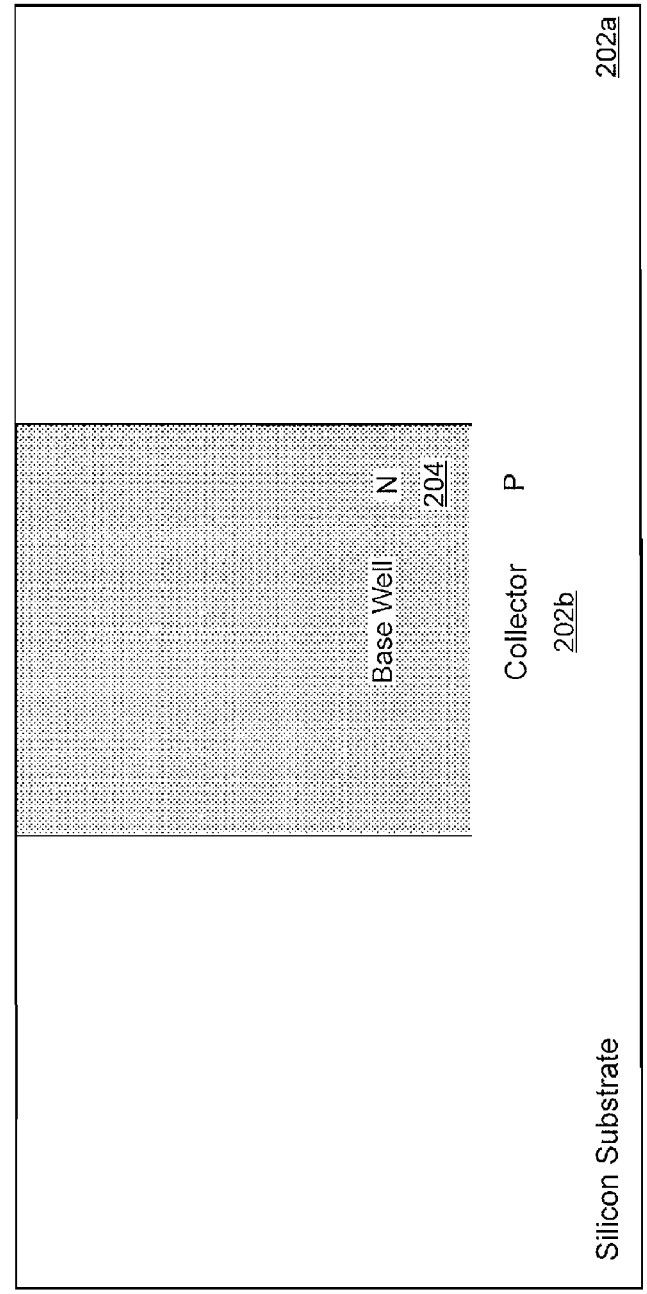
FIG. 2A illustrates a cross-sectional view, which includes a portion of a wafer processed according to an embodiment of the present invention, corresponding to an initial step in the flowchart in FIG. 1.

Referring now to FIG. 2A, structure 270 of FIG. 2A shows a structure including a substrate, after completion of step 170 of flowchart 100 in FIG. 1. Structure 270 includes semiconductor substrate 202a, wide collector 202b, and base well 204.

In structure 270, semiconductor substrate 202a comprises single-crystal semiconductor material. For example, in the present embodiment, semiconductor substrate 202a is a silicon substrate and comprises monocrystalline silicon. As shown in FIG. 2A, in the present embodiment, semiconductor substrate 202a is a P type substrate. It is noted that in other embodiments, semiconductor substrate 202a is an N type substrate or is an undoped substrate. Wide collector 202b, which is P type, is situated in semiconductor substrate 202a. In some embodiments, wide collector 202b can comprise a doped region of semiconductor substrate 202a, which can be a same conductivity type or a different conductivity type as semiconductor substrate 202a. However, in the present embodiment, wide collector 202b shares its conductivity with semiconductor substrate 202a.

Referring to step 170 in FIG. 1 and structure 270 in FIG. 2A, step 170 of flowchart 100 comprises forming base well 204 in wide collector 202b that is situated in semiconductor substrate 202a. Base well 204 can be formed, for example, by implanting ions into substrate 202b and performing an implant anneal to diffuse the dopants in substrate 202b. As shown in FIG. 2A, base well 204 is an N well in the present embodiment and can have a depth of, for example, approximately 200 to approximately 300 nanometers.

The present embodiment is compatible with a CMOS process of fabricating a fin field-effect transistor (FET), and more particularly, a P channel fin FET. For example, step 170 can also be utilized to form an N well of a fin FET structure (not shown in FIG. 2A).

Figure 2B:
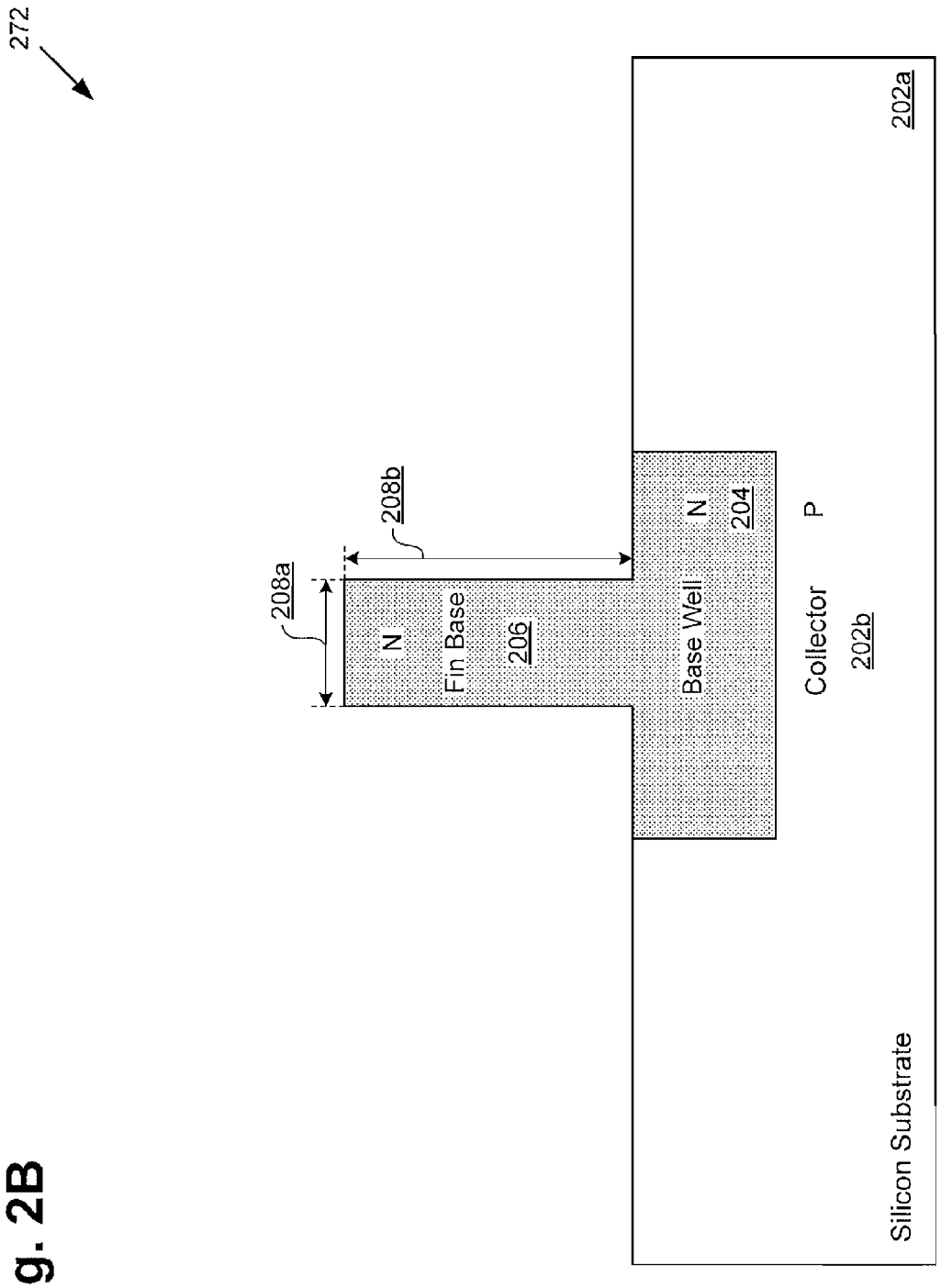
FIG. 2B illustrates a cross-sectional view, which includes a portion of a wafer processed according to an embodiment of the present invention, corresponding to an intermediate step in the flowchart in FIG. 1.

Referring to step 172 in FIG. 1 and structure 272 in FIG. 2B, step 172 of flowchart 100 comprises etching base well 204 to form fin base 206. For example, in one embodiment a mask is deposited over structure 270 in FIG. 2A (not shown in FIG. 2B). The mask can be, for example, a hard mask comprising an oxide or a nitride, and can be utilized to define fin base 206 when etching base well 204. Subsequently, the mask may be removed from fin base 206.

As shown in FIG. 2B, in the present embodiment, semiconductor substrate 202a and wide collector 202b are also etched while etching base well 204 to form fin base 206. Base fin 206 is disposed over wide collector 202b. Base well 204 is below fin base 206, where base well 204 is situated in wide collector 202b. In the present embodiment, base well 204 and fin base 206 together resemble an inverted "T" that extends into FIG. 2B through wide collector 202b. As specific examples, fin base 206 can be of width 208a that can range from, for example, approximately 10 nanometers to approximately 100 nanometers. Fin base 206 can also be of height 208b that can range from, for example, approximately 70 nanometers to approximately 80 nanometers.

In the CMOS process of fabricating the fin FET described above, step 172 can also be utilized to form a fin of the fin FET structure (not shown in FIG. 2B). It will be appreciated that the fin of the fin FET structure will be of height 208b. However, the fin of the fin FET structure can be of a width that is different than width 208a. The result of step 172 of flowchart 100 is illustrated by structure 272 in FIG. 2B.

Figure 2C:
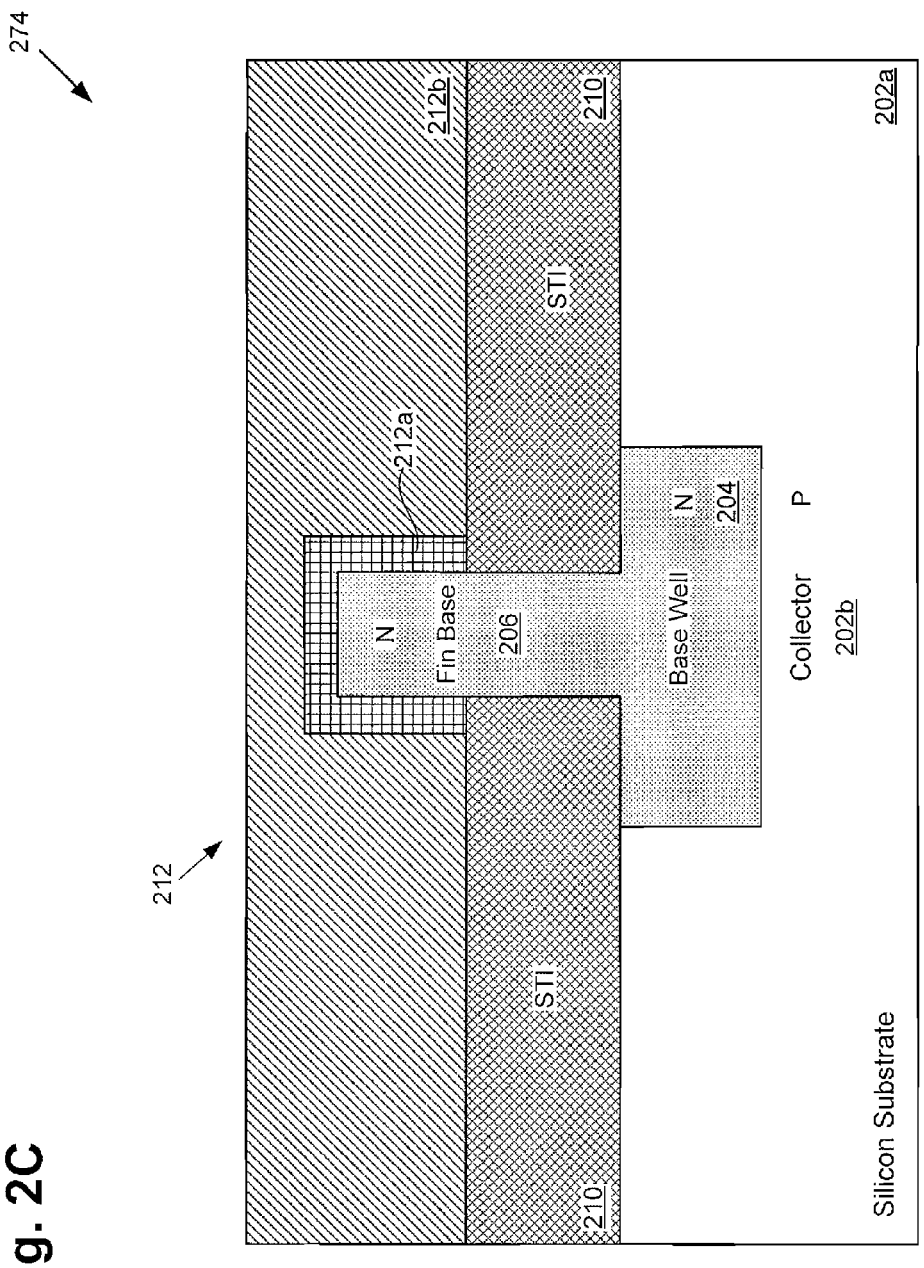
FIG. 2C illustrates a cross-sectional view, which includes a portion of a wafer processed according to an embodiment of the present invention, corresponding to an intermediate step in the flowchart in FIG. 1.

Referring to step 174 in FIG. 1 and structure 274 in FIG. 2C, step 174 of flowchart 100 comprises forming dielectric layer 210 surrounding fin base 206 and forming gate stack 212 over dielectric layer 210 and fin base 206.

Dielectric layer 210 comprises one or more dielectric materials and can be formed, for example, by depositing the one or more dielectric materials over structure 272 in FIG. 2B. Subsequently, portions of the one or more dielectric materials can be removed to form dielectric layer 210, shown in FIG. 2C. In the present embodiment, dielectric layer 210 is a shallow trench insulation (STI) layer and is formed over wide collector 202b. Fin base 206 is surround by, but protrudes above dielectric layer 210.

Gate stack 212 can be formed over fin base 206 after forming dielectric layer 210. Gate stack 212 comprises gate dielectric layer 212a and gate electrode layer 212b. Gate stack 212 can be formed, for example, by depositing and removing portions of one or more gate dielectric materials over fin base 206. Subsequently, one or more gate electrode materials can be deposited over gate dielectric layer 212a and a chemical mechanical planarization (CMP), or other planarization process may be performed on the one or more gate electrode materials to form gate electrode layer 212b.

In the CMOS process of fabricating the fin FET described above, step 174 can also be utilized to form a gate stack of the fin FET structure (not shown in FIG. 2C). As such, in various embodiments, gate stack 212 comprises any suitable gate stack for the fin FET structure. For example, in one embodiment, gate dielectric layer 212a comprises a high-K dielectric layer and gate electrode layer 212b comprises a metal gate electrode layer. In one embodiment, gate dielectric layer 212a comprises an oxide and/or a nitride layer and gate electrode layer 212b comprises polysilicon, such that gate stack 212 is a poly-SiON gate stack. The result of step 174 of flowchart 100 is illustrated by structure 274 in FIG. 2C.

Figure 2D:
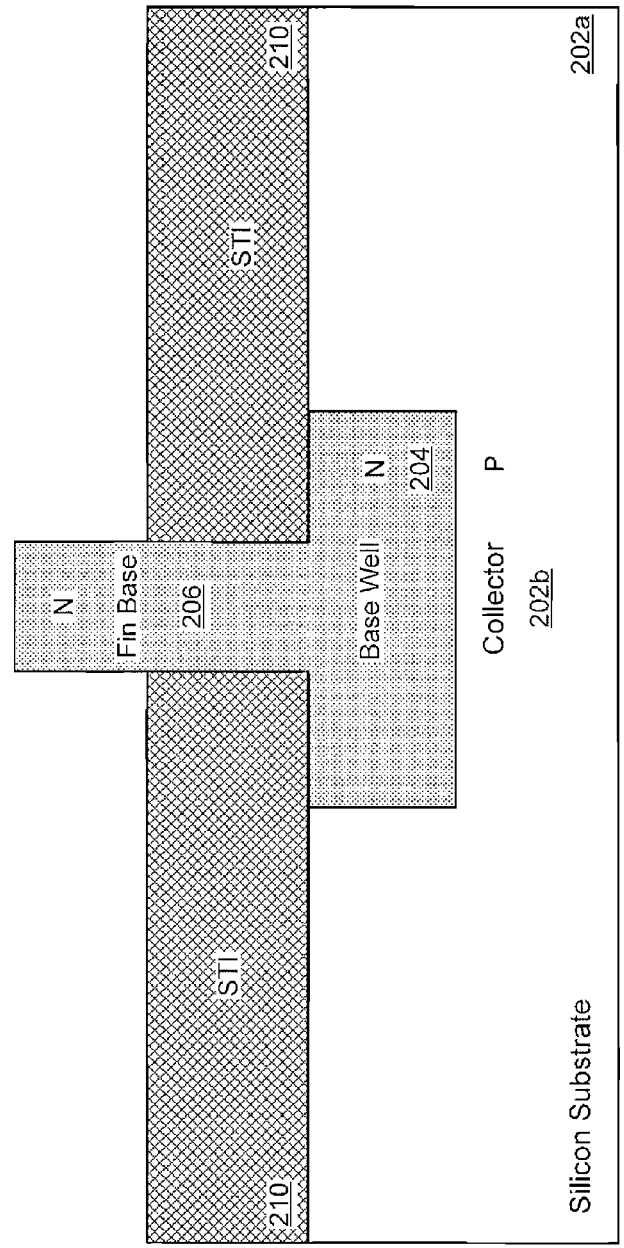
FIG. 2D illustrates a cross-sectional view, which includes a portion of a wafer processed according to an embodiment of the present invention, corresponding to an intermediate step in the flowchart in FIG. 1.

Referring to step 176 in FIG. 1 and structure 276 in FIG. 2D, step 176 of flowchart 100 comprises removing gate stack 212 from fin base 206. As shown in FIG. 2D, gate stack 212 has been removed from fin base 206, such that no portion of gate stack 212 is on fin base 206.

As described above, in the CMOS process of fabricating the fin FET, step 176 can also be utilized to form a gate stack of the fin FET structure. Similarly, step 174 can be utilized to pattern and etch the gate stack of the fin FET structure to form a gate of the fin FET structure (not shown in FIG. 2D). Thus, after step 2D, gate stack 212 may be etched so that the fin of the fin FET structure has regions at each end thereof exposed, which are designated for source/drain formation. Meanwhile, gate stack 212 is completely removed from fin base 206, as the present embodiment does not require gate stack 212 for a fin-based bipolar junction transistor (BJT) to be formed from structure 276. As such, it will be appreciated that forming gate stack 212 over fin base 206 and removing gate stack 212 from fin base 206 are optional, but advantageously allow for the fin-based BJT to be efficiently fabricated alongside the fin FET in the CMOS process. The result of step 176 of flowchart 100 is illustrated by structure 276 in FIG. 2D.

Referring to step 178 in FIG. 1 and structure 278 in FIG. 2E, step 178 of flowchart 100 comprises epitaxially growing semiconductor layer 214 on fin base 206. As shown in FIG. 2E, in the present embodiment, semiconductor layer 214 is on dielectric layer 210. Also in the present embodiment, semiconductor layer 214 comprises a polycrystalline semiconductor material. More particularly, semiconductor layer 214 comprises polysilicon. In the present embodiment, semiconductor layer 214 encompasses fin base 214 on all surfaces above dielectric layer 210. Semiconductor layer 214 can be grown to a thickness of, for example, approximately 100 nanometers.

In the CMOS process of fabricating the fin FET described above, step 178 can also be utilized to epitaxially grow semiconductor layers on the regions on the fin of the fin FET structure that are designated for source/drain formation. Doing so can allow for reduced contact resistance to the fin FET in those regions. It is noted that the gate of the fin FET structure will limit growth of the semiconductor layers. The result of step 178 of flowchart 100 is illustrated by structure 278 in FIG. 2E.

Figure 2F:
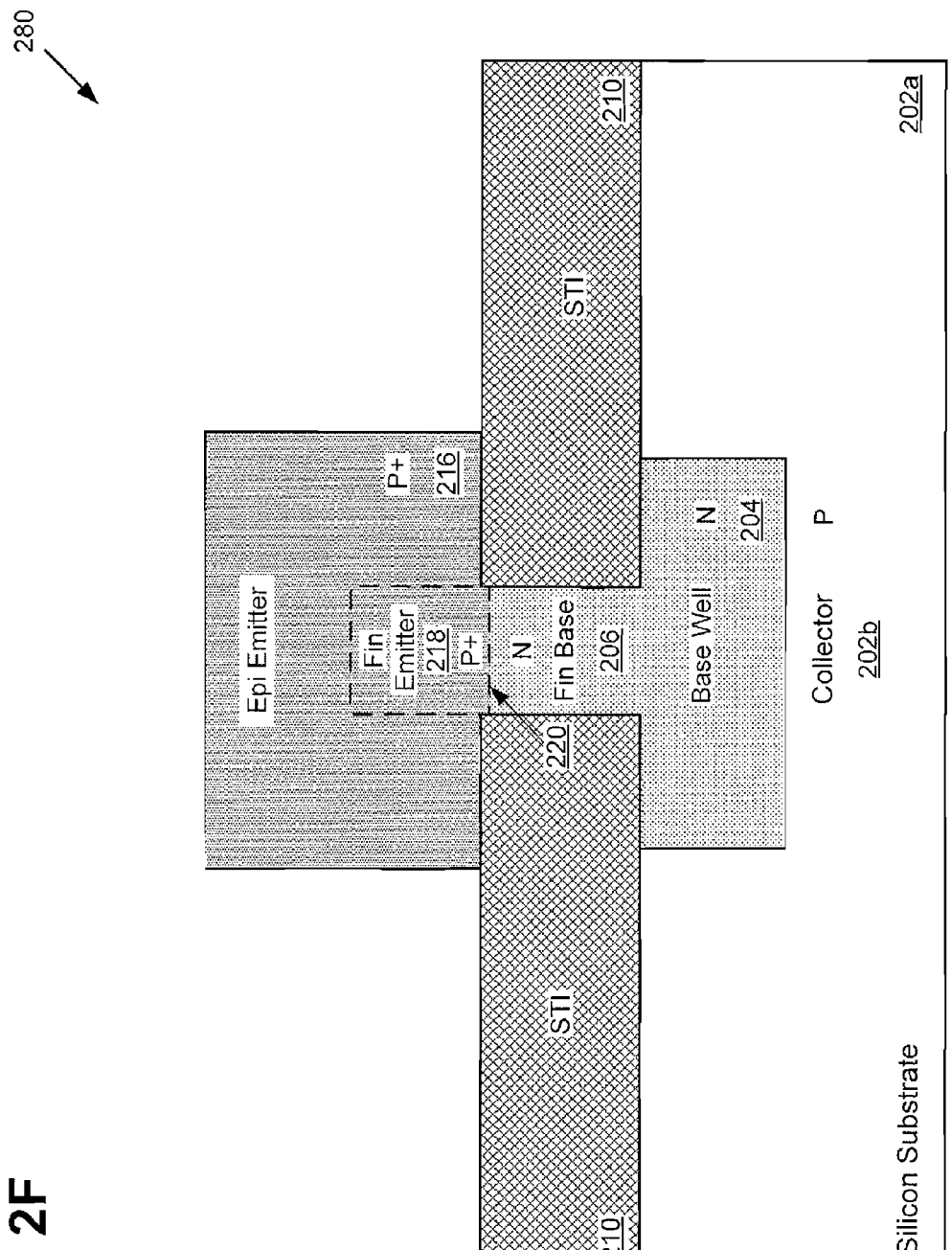
FIG. 2F illustrates a cross-sectional view, which includes a portion of a wafer processed according to an embodiment of the present invention, corresponding to a final step in the flowchart in FIG. 1.

Referring to step 180 in FIG. 1 and structure 280 in FIG. 2F, step 180 of flowchart 100 comprises doping semiconductor layer 214 and fin base 206 to form epi emitter 216 and fin emitter 218. In the present embodiment, fin emitter 218 extends below epi emitter 216, as shown in FIG. 2F. Also in the present embodiment, ions are implanted into semiconductor layer 214 and into fin base 206, such that epi emitter 216 and fin emitter 218 are P type and have P+ conductivity. Thus, fin emitter 218 is formed in fin base 206 of structure 278 and each comprises single-crystal semiconductor material (e.g. monocrystaline silicon), whereas epi emitter 216 comprises polycrystalline semiconductor material (e.g. polysilicon). By doping semiconductor layer 214 and fin base 206 to form epi emitter 216 and fin emitter 218, narrow base-emitter junction 220 is formed.

In the CMOS process of fabricating the fin FET described above, step 180 can also be utilized to form a source and a drain of the fin FET in the regions of the fin FET structure that are designated for source/drain formation. Thus, the source and drain regions of the fin FET can be of the same or similar conductivity as epi emitter 216 and fin emitter 218. The result of step 180 of flowchart 100 is illustrated by structure 280 in FIG. 2F.

Subsequently, additional steps may be performed including contact formation for epi emitter 216, base well 204, and collector 202 of the fin-based BJT (not shown in FIG. 2F). These contacts can be made, for example, similar to respective contacts for the source and drain, the N well, and the P substrate of the fin FET and in the same process steps.

As has been described above, in embodiments of the present invention, a fin-based BJT can be efficiently fabricated alongside a fin FET in a CMOS process, and in some embodiments, fabrication of the fin-based BJT requires no extra steps from those required to fabricate the fin FET. It is noted that embodiments of the present invention are not limited to the specific embodiment described above. For example, although steps 170 through 180 as described above each contribute to formation of the fin FET, in some embodiments additional steps may be included, or steps may be specific to formation of the fin-based BJT. As one specific example, step 180 may not be utilized for formation of the source and drain regions of the fin FET. As another example, an additional step may include implanting additional ions into epi emitter 216 and/or fin emitter 218, but not into any part of the fin FET.

Furthermore, it will be appreciated that embodiments of the present invention include methods that are independent from fin FET formation. For example, steps 170 through 180 in FIG. 1 can be for a dedicated method of fabrication of a fin-based BJT or can be shared with fabrication of other components not specifically described herein. While the embodiment described above relates to fabrication of a PNP fin-based BJT and a P channel fin FET, it will be appreciated that an NPN fin-based BJT and an N channel fin FET can be fabricated in accordance with embodiments of the present invention.

Figure 3:
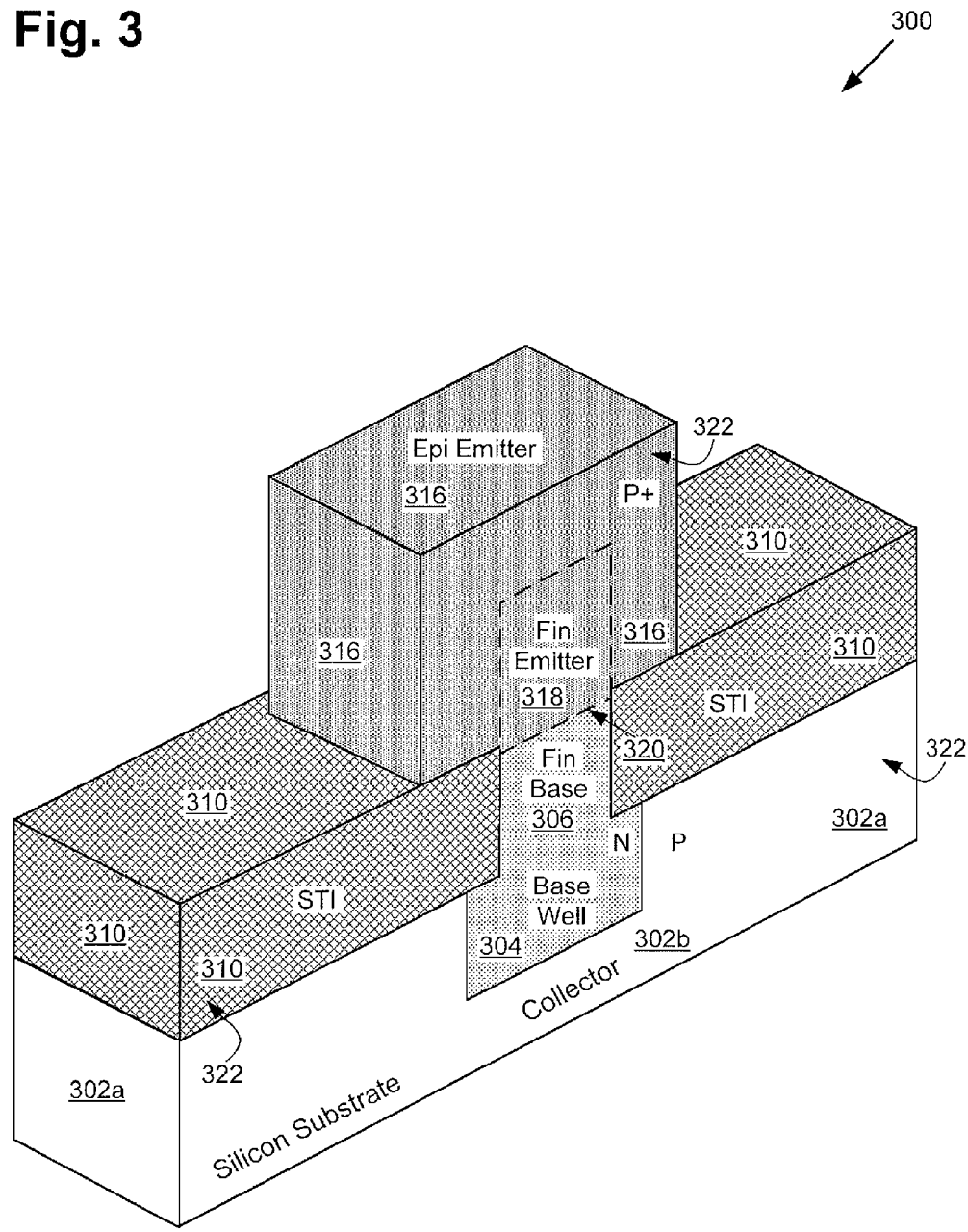
FIG. 3 illustrates a perspective view, which includes a portion of a fin-based bipolar junction transistor (BJT), according to an embodiment of the present invention.

FIG. 3 illustrates a perspective view, which includes a portion of fin-based BJT 300, according to an embodiment of the present invention. Fin-based BJT 300 can be fabricated in accordance with the method that has been described above with respect to flowchart 100 in FIG. 1. In FIG. 3, face 322 of fin-based BJT 300 corresponds to the cross-sectional view of structure 280 that is shown in FIG. 2F. Thus, semiconductor substrate 302a, wide collector 302b, base well 304, fin base 306, dielectric layer 310, epi emitter 316, fin emitter 318, and narrow base-emitter, junction 320 in FIG. 3 correspond respectively to semiconductor substrate 202a, wide collector 202b, base well 204, fin base 206, dielectric layer 210, epi emitter 216, fin emitter 218, and narrow base-emitter junction 220 in FIG. 2F.

In fin-based BJT 300, wide collector 302b is situated in semiconductor substrate 302a. Fin base 306 is disposed over wide collector 302b with base well 304 being below fin base 306, where base well 304 is situated in wide collector 302b. As shown in FIG. 3, dielectric layer 310, which is an STI layer in the present embodiment, is formed over wide collector 302b and fin base 306 is disposed within dielectric layer 310 over wide collector 302b. As shown in FIG. 3, epi emitter 316 is formed over dielectric layer 310 and fin base 306. Fin emitter 318 and epi emitter 316 are disposed over fin base 306, where epi emitter 316 is epitaxially formed on fin emitter 318. Fin base 306 and fin emitter 318 are integral to and continuous with semiconductor substrate 302a having been formed therefrom. As such, in the present embodiment, fin base 306 and fin emitter 318 each comprise single-crystal semiconductor material, and more particularly, comprise monocrystaline silicon. Also, in the present embodiment, epi emitter 316 comprises polycrystalline semiconductor material, and more particularly, comprises polysilicon.

Fin-based BJT 300 has high switching capability and high current conduction capability. Furthermore, as described above, fabrication of fin-based BJT 300 can be integrated into CMOS processes. A conventional BJT fabricated in a CMOS process has poor performance and thus is not suitable for high performance applications. One cause of the poor performance of the conventional BJT is that the emitter is necessarily much smaller than the base. As such, the conventional BJT has high emitter series resistance and low current conduction capability. However, fin-based BJT 300 comprises epi emitter 316 which can reduce emitter series resistance of fin-based BJT 300 by allowing for an increased size ratio between epi emitter 316/fin emitter 318 and base well 304/fin base 306. Moreover, epi emitter 316 provides for increased current conduction for fin-based BJT 300.

Another cause of the poor performance of the conventional BJT is that its base-emitter junction is not well defined. As such, the conventional BJT has high base leakage current. However, narrow base-emitter junction 320 of fin-based BJT 300 is formed by fin base 306 and fin emitter 318. Thus, narrow base-emitter junction 320 of fin-based BJT 300 is well defined, thereby providing for reduced base leakage current. Fin-based BJT 300 is thereby suitable for high performance applications. Additionally, it will be appreciated that the depth of fin emitter 318, and thus the depth of narrow base-emitter junction 320, can be adjusted by adjusting the doping process utilized in step 180. Furthermore, width 208a (See FIG. 2B), and thus the width of narrow base-emitter junction 320, can be adjusted by adjusting the etching process (e.g. the hard mask) utilized in step 172. As such, performance of fin-based BJT 300 can be easily optimized.

Thus, as described above with respect to FIGS. 1, 2A through 2F, and 3, embodiments of the present invention can provide for a fin-based BJT that has improved performance over a conventional BJT while being fabricated in a CMOS processes.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A fin-based bipolar junction transistor (BJT) comprising:
   a wide collector situated in a semiconductor substrate;
   a fin base disposed over said wide collector;
   a base well disposed below said fin base; and
   a fin emitter and an epi emitter disposed over said fin base, wherein:
   said base well is situated in said wide collector;
   a narrow base-emitter junction of said fin-based BJT is formed by said fin base and said fin emitter; and
   said epi emitter provides increased current conduction for said fin-based BJT.

2. The fin-based BJT of claim 1, wherein said epi emitter is epitaxially formed on said fin emitter.

3. The fin-based BJT of claim 1, comprising a dielectric layer formed over said wide collector.

4. The fin-based BJT claim 1, wherein said fin base and said fin emitter are integral to and continuous with said semiconductor substrate.

5. The fin-based BJT claim 1, wherein said fin base and said fin emitter comprise monocrystalline silicon.

6. The fin-based BJT claim 1, wherein said epi emitter comprises polysilicon.

7. The fin-based BJT of claim 1, wherein a size of the epi emitter and the fin emitter, collectively, is greater than a size of the base well and the fin base, collectively.

8. The fin-based BJT of claim 3, wherein said fin base is disposed within said dielectric layer and over said wide collector.

9. The fin-based BJT of claim 3, wherein said epi emitter is formed over said dielectric layer and said fin base.

10. The fin-based BJT of claim 3, wherein said dielectric layer is a shallow trench insulation (STI) layer.

11. A fin-based bipolar junction transistor (BJT) comprising:
    a collector situated in a semiconductor substrate;
    a fin base disposed over said collector;
    a base well disposed below said fin base; and
    a fin emitter and an epi emitter disposed over said fin base, wherein:
    said epi emitter provides increased current conduction for said fin-based BJT; and
    said base well is situated in said collector.

12. The fin-based BJT of claim 11, wherein said epi emitter is epitaxially formed on said fin emitter.

13. The fin-based BJT of claim 11, comprising a dielectric layer formed over said collector.

14. The fin-based BJT of claim 11, wherein said fin base and said fin emitter are integral to and continuous with said semiconductor substrate.

15. The fin-based BJT of claim 11, wherein said fin base and said fin emitter comprise monocrystalline silicon.

16. The fin-based BJT claim 11, wherein said epi emitter comprises polysilicon.

17. The fin-based BJT claim 11, wherein a size of the epi emitter and the fin emitter, collectively, is greater than a size of the base well and the fin base, collectively.

18. The fin-based BJT of claim 13, wherein said fin base is disposed within said dielectric layer and over said collector.

19. The fin-based BJT of claim 13, wherein said epi emitter is formed over said dielectric layer and said fin base.

20. The fin-based BJT of claim 13, wherein said dielectric layer is a shallow trench insulation (STI) layer.

* * * * *